United States Patent [19]

Rofer et al.

[11] Patent Number: 4,812,129

[45] Date of Patent: Mar. 14, 1989

[54] SURFACE MOUNT CONNECTOR

[75] Inventors: David Rofer, Fountain Valley; Peter J. Hyzin, El Toro; Thomas W. Conrad, Altadena, all of Calif.

[73] Assignee: ITT Corporation, New York, N.Y.

[21] Appl. No.: 82,267

[22] Filed: Aug. 6, 1987

[51] Int. Cl.$^4$ .............................................. H05K 1/00

[52] U.S. Cl. ...................................... 439/79; 439/908; 439/891

[58] Field of Search ............... 439/253, 254, 256, 257, 439/663, 665, 735, 737, 743, 747, 784, 801, 805, 823, 859, 891, 908, 79, 55

[56] References Cited

U.S. PATENT DOCUMENTS

| | | | |
|---|---|---|---|
| 3,170,752 | 2/1965 | Van Horssen | 439/891 |
| 3,470,522 | 9/1969 | Lawrence | 339/14 |
| 3,569,918 | 3/1971 | Arnold | 439/891 |
| 4,418,972 | 12/1983 | Benasutti | 339/14 |
| 4,434,552 | 3/1984 | Brush, Sr. et al. | 439/891 |
| 4,529,260 | 7/1985 | Smith | 339/217 |
| 4,530,551 | 7/1985 | Benasutti | 439/908 |
| 4,533,202 | 8/1985 | Pohl | 339/176 |
| 4,628,410 | 12/1986 | Goodman et al. | 361/413 |
| 4,631,637 | 12/1986 | Romania et al. | 361/413 |
| 4,702,707 | 10/1987 | Hillbish | 439/80 |

*Primary Examiner*—David Pirlot
*Attorney, Agent, or Firm*—Thomas L. Peterson

[57] ABSTRACT

A surface mount connector in which contacts mounted in two or more rows of contact passages have tails bent so that their end portions lie in a common plane for engaging traces on a printed circuit board. Each contact is a two piece part. The two parts are mounted in the corresponding contact passage from the opposite end faces of the insulator, so that the tails may be bent during the forming of the rear parts of the contacts rather than after mounting of the contacts in the passages. A retention arrangement is provided between the front and rear parts of the contacts which allows either a permanent connection between the parts, or a releasable connection so that the front and rear parts of the contacts may be removed from the passages and replaced if necessary.

6 Claims, 3 Drawing Sheets

FIG. 5
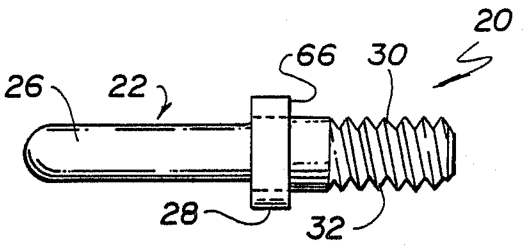
FIG. 6
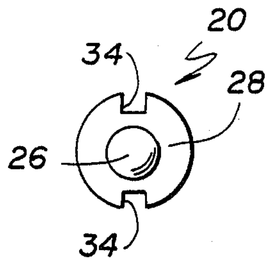
FIG. 7
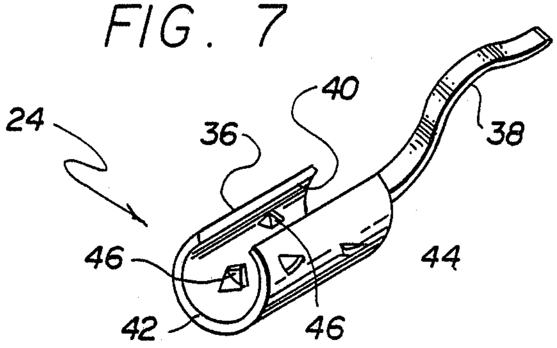
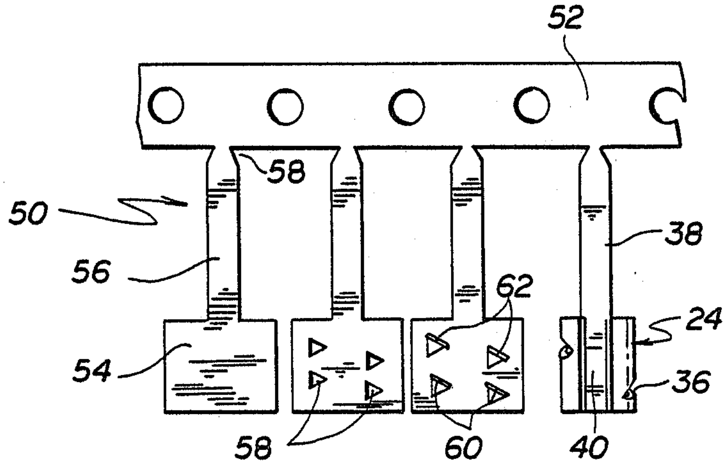
FIG. 8

FIG. 9
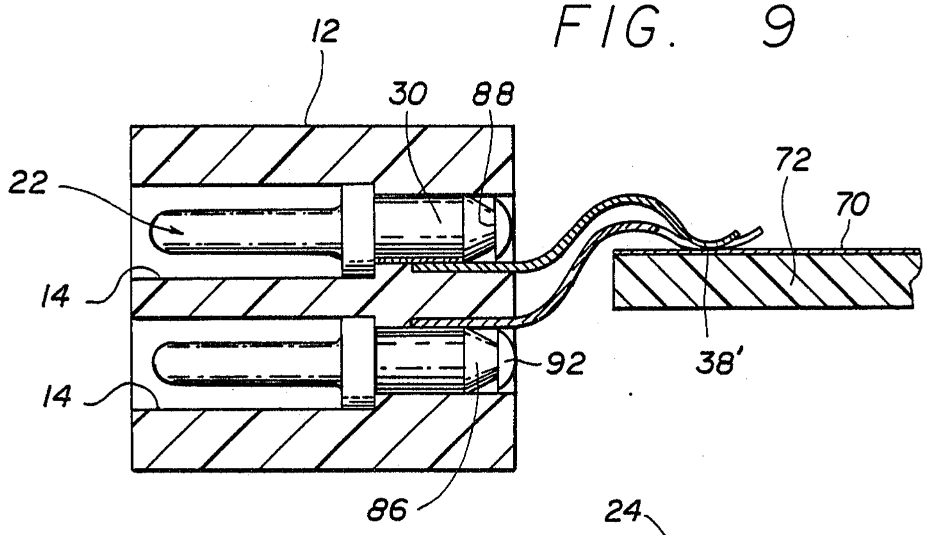
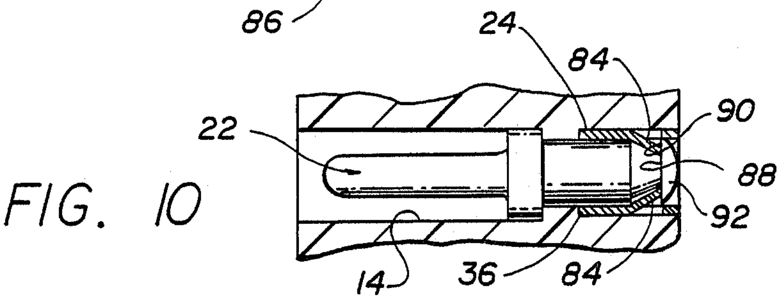
FIG. 10
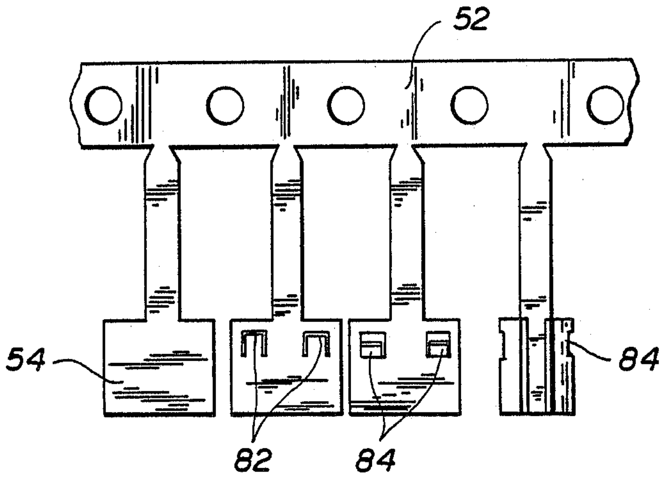
FIG. 11

SURFACE MOUNT CONNECTOR

BACKGROUND OF THE INVENTION

The present invention relates generally to an electrical connector and, more particularly, to a surface mount connector.

Typically, a surface mount connector comprises an insulator containing at least two rows of contact passages. The contacts mounted in the two rows of passages have rearwardly extending tails that are bent so that the end portions of the tails lie in a common plane for engaging conductive traces on the surface of a printed circuit board. The tails are normally attached to the traces by re-flow soldering techniques. Normally the contacts are initially mounted into the passages in the connector insulator while the tails are straight. Thereafter, the tails are formed into their desired configuration so that their end portions will lie in a common plane. Such forming of the tails after the contacts are mounted in the insulator is often quite difficult to accomplish particularly when the spacing between the rows of contacts, and the adjacent contacts in each row, is very close. U.S. Pat. Nos. 4,418,972; 4,628,410 and 4,631,637 disclose various types of surface mount connectors.

It is the object of the present invention to provide a surface mount connector in which the tails of the contacts may be properly bent for engaging the surface of a printed board prior to mounting of the contacts in the connector insulator, thus overcoming the difficulties attendant with prior art connectors in forming the tails after the contacts are mounted in the insulator. Another object of the invention is to provide a surface mount connector which is relatively inexpensive and easy to assembly.

SUMMARY OF THE INVENTION

According to a principal aspect of the present invention, there is provided a surface mount connector in which the contacts are formed of two pieces, namely, a front mating section and a rear section which embodies the terminal or tail that engages the conductive traces on a printed board. Preferably the rear sections of the contacts are made from stamped and formed sheet metal. The tails are properly shaped during the forming operation. Thereafter, the rear sections of the contacts are inserted into the contact passages in the connector insulator from the rear face of the insulator. The front sections of the contacts are inserted into the passages from the front face of the insulator. Cooperating means is provided on the rear portion of the front section of each contact, and the front portion of the rear section of the contact to connect the two sections together when they are installed in the insulator. Each row of contacts may be initally attached to a carrier strip which facilitates insertion of the contacts simultaneously into a corresponding row of contact passages in the insulator. The front sections of the contacts are then pushed into the front of the contact passages to cause the front and rear sections to be connected together. Thus, by the present invention, the rear sections of the contacts with the tails thereon are fully formed prior to insertion of the rear sections into the connector insulator, thus avoiding the necessity of attempting to form the tails of the contacts after the contacts are mounted in the insulator, which is extremely difficult if not impossible to accomplish with very closely spaced contacts. The contacts may be manufactured relatively inexpensively, and they are easy to assemble.

Other objects, aspects and advantages of the present invention will become apparent from the following description taken in connection with the accompanying drawings.

BRIEF DESCRIPTION OF THE DRAWINGS

FIG. 5 is a side elevational view of the front section of the contact illustrated in FIGS. 1 to 4;

FIG. 6 is the front end view of the front section of the contact illustrated in FIG. 5;

FIG. 7 is a front perspective view of the rear section of the contact illustrated in FIGS. 1 to 4;

FIG. 8 is a plan view of a progressive die stamping showing four stages of the forming of the rear section of the contact illustrated in FIG. 7;

FIG. 9 is a vertical sectional view similar to FIG. 1 showing a connector containing an alternative form of the contact of the present invention;

FIG. 10 is a horizontal sectional view similar to FIG. 4 showing the contact illustrated in FIG. 9; and FIG. 11 is a plan view of a progressive die stamping for the contact illustrated in FIGS. 9 and 10.

DESCRIPTION OF THE PREFERRED EMBODIMENTS

Figure 1:
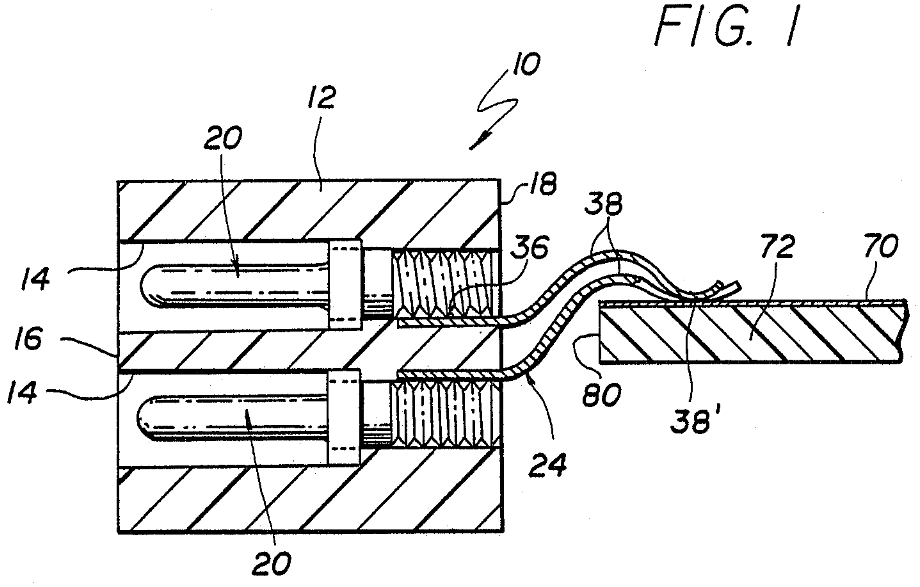
FIG. 1 is a vertical section view taken along line 1—1 of FIG. 2 illustrating one embodiment of the present invention in which two contacts are shown with their tails engaging the surface of a printed board.

Referring is now made to FIGS. 1 to 7 of the drawings in detail, which show the first embodiment of the invention in which the front and rear sections of each contact are releasably connected in the connector insulator so that the contact may be removed from the insulator and replaced by a new contact. The connector, generally designated 10, comprises an elongated insulator 12 containing two parallel rows of contact passages 14. Each passage 14 extends from the front face 16 to the rear face 18 of the insulator. A two-piece contact, generally designated 20, is mounted in each of the passages 14.

Referring now to FIGS. 5–7, each contact is comprised of a forward mating section 22 and a rear termination section 24. The forward section embodies a forward mating portion 26, an outwardly extending annular flange 28 and a rear portion 30. The rear portion is formed with screw threads 32. Axial slots 34 are formed in opposite sides of flange 28 which may receive a spanner wrench or like tool, not shown, that facilitates the rotating of the forward mating section 22 of the contact in its corresponding passage 14. The forward section 22 of the contact may be manufactured by machining, cold heading, or stamping and forming. Although the forward mating section 26 is shown as being a pin contact, it could also be in the form of a socket contact, if desired.

The rear termination section 24 of the contact comprises a tubular forward portion 36 and a rearwardly extending terminal 38 in the form of a bent tail. The rear section 24 of the contact is a stamped and formed sheet metal element. Preferably the tubular forward portion 36 is formed with a longitudally extending slot 40 therein which extends from the forward edge 42 to the rear edge 44 of the tubular portion. A plurality of inwardly extending dimples or projections 46 are formed in the tubular portion 36 which are spaced circumferentialy and axially so as to form segments of a screw thread which matches the screw threads 32 on the rear portion 30 of the forward mating section 22 of the contact.

Reference is now made to FIG. 8 of the drawings which shows a progressive die stamping 50 from which the rear termination section 24 of the contact is produced. The stamping includes a carrier strip 52 which is initially formed at its left end with a plurality (only one being shown) of generally square sheet metal blanks 54 each attached to the carrier strip 52 by a narrow strip 56 which ultimately becomes the tail 38 of the rear section 24 of the contact. The strip 56 is connected to the carrier strip 52 by a reduced width section 58 at which the contact part may be readily removed from the carrier strip after a plurality of contact parts are mounted in the connector insulator. FIG. 8 shows four stages of the forming of the rear section of the contact. Initially the carrier strip 52, blank 54 and connecting strip 56 are formed by a stamping operation on a sheet or metal, such as berylium copper. In a second stage of the operation, a plurality of angular slits 58, four being shown in FIG. 8 by way of example, are formed in the blank 54. At the next stage the material of the blank behind each slit is deformed upwardly to form a plurality of dimples 60 having front edges 62. At the next stage of the operation, the blank 54 is formed into the tubular portion 36 of the contact with the sides of the blank spaced apart to form the slot 40. At this or an additional stage, the connecting strip 56 is formed into the desired shape to produce the bent tail 38. The particular shape given to the tail 38 depends upon whether the contact is mounted in the upper or lower row of contact passages, as seen in FIG. 1.

Referring back to FIGS. 1, 2 and 4, it is seen that a radially inwardly extending annular flange 64 is provided on the wall of each contact passage 14, between the front and rear faces of the insulator 12. The flange 28 on the forward mating section of 22 of the contact provides a rearwardly facing shoulder 66 which engages the front of the flange 64 when the contact section 22 is inserted into the passage 14 from the front face 16 of the insulator. When the rear termination section 24 of the contact is mounted into the passage from the rear face 18 of the insulator, its forward edge 42 butts against the opposite side of the flange 64. The dimples 46 of the tubular forward portion 36 of the rear termination section 24 of the contact may be either rigid or resilient. If the dimples are rigid, the forward and rear sections of the contact are interconnected by rotating the forward section clockwise (if right hand threads are used) relative to the rear section, by the use of a spanner wrench inserted into the contact passage 14 from the front of the insulator, so that the rear portion 30 of the forward section 22 of the contact will make a threaded engagement with the matching screw thread segments provided by the dimples 46 on the rear section of the contact. If the dimples 46 are sufficiently resilient, the forward section 22 of the contact may be connected to the rear section by simply axially pushing the rear portion 30 of the forward section into the tubular forward portion 36 of the rear section of the contact. In either case, the two sections can be released from each other and removed from the insulator by rotating the forward section in a counterclockwise direction to release its threaded rear portion 30 from the dimples 46.

Figure 2:
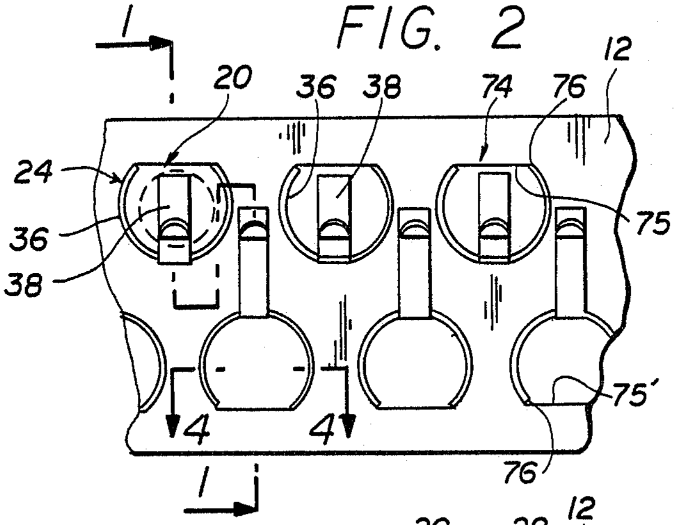
FIG. 2 is a fragmentary view showing a portion of the rear of the connector illustrated in FIG. 1, wherein one form of keying means is disclosed for keying the contacts so that their tails are properly oriented.
Figure 3:
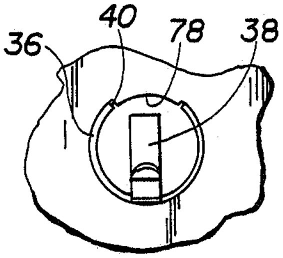
FIG. 3 is a fragmentary view of the rear of the connector of the invention showing a different form of keying means for the contacts.
Figure 4:
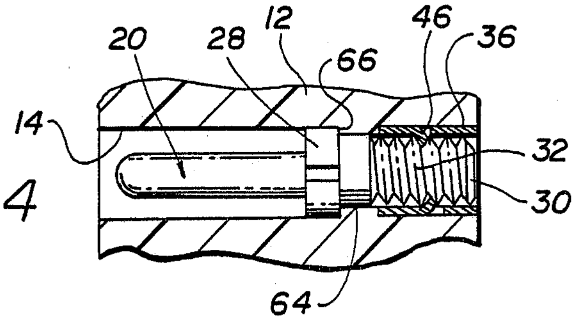
FIG. 4 is a fragmentary horizontal sectional view taken along line 4—4 of FIG. 2 showing the connecting arrangment for the front and rear sections of the contact of the invention.

In order to orient the tails 38 of the contacts so that their concave mating surfaces 38' are properly positioned for engaging the conductive traces 70 (only one being seen in FIG. 1) on the printed circuit board 72 to which the two rows of contacts of the connector 10 are to be connected, a keying arrangement 74 is provided between the rear section 24 of each contact and the contact passage. As seen in FIG. 2, such keying arrangement may constitute a flat surface 75 on the upper wall of each contact passage in the upper row of passages, and a flat surface 75' on the lower wall of each contact passage in the lower row. The longitudinally extending edges 76 of the tubular forward portion 36 of the rear section 24 of each contact will engage the flats 75 or 75' only when the rear sections of the contacts are properly oriented as illustrated in FIGS. 1 and 2. Each flat 75 and 75' extends rearwardly from the flange 64 to the rear face 18 of the insulator. Alternatively, as illustrated in FIG. 3, the keying arrangement may constitute an inwardly extending longitudinal key 78 which slides into the slot 40 of the tubular forward portion 36 of the rear termination section 24 when the latter is inserted into the passage 14.

As seen in FIG. 2, the two rows of contact passages 14 are staggered relative to each other, in order to achieve close longitudinal spacing of the tails 38 of the contacts in the two rows along the side edge 80 of the board 72. In order to install the contacts into the insulator 12, a carrier strap 52, carrying a plurality of rear termination sections 24 of the contact, is positioned behind the insulator with the tubular forward portions 36 of the rear sections aligned with one row of contact passages. The carrier strap is then moved toward the insulator to push the tubular portions 36 into the rear of the passages 14 until the forward edges 42 thereof engage the flanges 64. When inserting the rear sections of the contacts into the upper row of passages 14 illustrated in FIG. 2, it is noted that the carrier strip is oriented so that the tails 38 are adjacent to the lower wall of the passages. When inserting the rear termination sections 24 of the contacts into the lower row of passages 14, the carrier strip is oriented so that the tails 38 are position adjacent to the upper wall of th passages. Thus, the tails of the two rows of contacts will be as close to each other as possible as seen in FIG. 1. It is further noted that the tails 38 of the lower row of contacts are bent in a direction generally opposite to the tails of the contacts in the upper row so that the concave mating surfaces 38' of the two sets of tails will lie in substantially a common plane for engaging the traces 70 on the board 72.

After the tubular forward portions 36 of the rear sections 24 of the contacts are assembled into the rear of the passages 14 in the two rows, blocking elements, not shown, are brought up into firm abutment against the rear face 18 of the insulator 12 to prevent any rearward movement of the rear sections 24 of the contacts when the forward mating sections 22 are assembled into the insulator from the front thereof. A explained previously herein, the forward mating sections 22 of the contacts may be assembled to the rear sections 24 either by pushing the forward mating sections axially into the tubular forward portions 36, when the dimples 46 are resilient, or by rotating the forward sections of the contacts to thread the rear portions thereof into the rear sections 24 of the contacts if the dimples 46 therein are rigid. In either case, it is preferable that a spanner wrench be inserted into the front of each contact passage to engage the slots 34 in the flange 28 to tightly thread the rear threaded portion 30 of the forward mating section of the contact into the tubular forward portion 36 of the rear section so that the rearward facing shoulder 66 on the forward section of the contact will tightly engage the front face of the flange 64 in the contact passage, and the forward edge 42 of the rear termination section of the contact will tightly engage the rear face of the flange 64. The screw threading of the two contact sections together ensures firm and precise axial positioning of the assembled contact in each passage 14, thereby eliminating any axial float of the contact in the passage. After the contacts are fully assembled in the connector insulator, the carrier strips 52 may be broken off from the ends of the tails 38 of the two rows of contacts and the blocking elements for the rear sections of the contacts may be removed from the rear face of the insulator 12.

To assure a low resistance connection between the front and rear sections of each two-piece contact 20, the rear termination section of the contact and/or the rear portion 30 of the forward mating section 22 of the contact may be provided with a solder coating prior to mounting of the contacts in the passages 14. Normally the tails 38 are provided with such a coating. A solder connection between the forward and rear sections of the contacts, and between the tails and the traces on the printed board 72, may be made in a single vapor phase soldering operation which heats the solder at both locations to make the desired electrical connections.

Reference is now made to FIGS. 9–11 of the drawings which show an alternative embodiment of the invention. The same reference numerals used in FIGS. 1–8 are used in FIGS. 9–11 to indicate like or corresponding parts. A best seen in FIG. 11, rather than forming dimples which constitute segments of a screw thread as in the first embodiment of the invention, generally "U" shaped slots 82 are formed in blank 54 leaving a pair of fingers 84. In the third stage of the progressive stamping and forming operation, the fingers 84, are bent upwardly so that when the blank 54 is formed into a generally tubular configuration in the fourth stage, the fingers 84 will extend inwardly toward the center of the tubular portion. Thus, the fingers 84 extend rearwardly and inwardly when the rear termination section 24 of the contact is mounted into the passage 14, as seen in FIG. 10. The rear portion 30 of the forward mating section 22 of the contact in the second embodiment of the invention is formed with a tapered region 86 which terminates in a forwardly facing annular shoulder 88, rather than being formed with screw threads as in the first embodiment of the invention. When the front and rear sections of the contact are interconnected in the passage 14, the free ends 90 of the fingers 84 engage the shoulder 88. Since the fingers are formed from sheet metal, they are radialy resilient. Thus, when the forward mating section 22 of the contact is pushed into the tubular forward portion 36 of the rear section of the contact, the fingers 84 will deflect radially outwardly when engaged by the curved rear end 92 of the forward mating section of the contact. Once the shoulder 88 passes the fingers 84, the fingers will snap radially inwardly to position their free ends against the shoulder 88, thereby firmly locking the two sections of the contact together. In this embodiment of the invention, the two sections of the contact cannot be disconnected as in the first embodiment of the invention. Otherwise, the structure and assembly of the connector illustrated FIGS. 9–11 is the same as that illustrated in FIGS. 1–8.

Although several embodiments of the invention have been disclosed herein for purposes of illustration, it will be understood that various changes can be made in the form, details, arrangement and proportions of the various parts in such embodiments without departing from the spirit and scope of the invention as defined by the appended claims.

What is claimed is:

1. An electrical connector comprising:

an insulator having a front face and a rear face with at least one contact passage extending therethrough opening at said faces;

a contact mounted in said passage, said contact having a forward mating section and a rear termination section;

said forward section of said contact being mounted in said passage from said front face;

said rear section of said contact being mounted in said passage from said rear face;

said forward section of said contact having a mating portion adjacent to said front face and a rear portion adjacent to said rear face;

said rear section of said contact embodying a generally tubular forward portion surrounding said rear portion of said front section of said contact, said tubular portion being slidably mounted in said passage;

said rear portion of said forward section of said contact embodying a generally forwardly facing shoulder;

means connecting said rear section of said contact to said rear portion of said front section of said contact, said connecting means comprising a radially movable resilient finger extending inwardly and rearwardly from said tubular portion with its end engaging shoulder;

means restricting axial movement of said contact in said passage; and said rear section of said contact embodying a terminal extending rearwardly from said rear face of said insulator.

2. An electrical connector comprising:

an insulator having a front face and a rear face with at least one contact passage extending therethrough opening at said faces;

a contact mounted in said passage, said contact having a forward mating section and a rear termination section;

said forward section of said contact being mounted in said passage from said front face;

said rear section of said contact being mounted in said passage from said rear face;

said forward section of said contact having a mating portion adjacent to said front face and a rear portion adjacent to said rear face;

said rear portion of said forward section of said contact having screw threads thereon;

said rear section of said contact embodying a generally tubular forward portion surrounding said rear portion of said front section of said contact, said tubular portion being slidably mounted in said passage;

said tubular portion embodying a plurality of dimples spaced axially and circumferentially from each other to form screw thread segments matching said screw thread on said rear portion of said forward section of said contact;

said dimples being sufficiently radially deformable to allow said rear portion of said forward section of said contact to be pushed into said threaded tubular portion of said rear section of said contact to connect said sections, said forward section being rotatable in relation to said rear section to permit said sections to be tightly secured relative to each other and to allow disassembly of said sections;

means restricting axial movement of said contact in said passage; and said rear section of said contact embodying a terminal extending rearwardly from said rear face of said insulator.

3. An electrical connector comprising:

an insulator having a least one passage therthrough;

a two-piece contact mounted in said passage;

means providing a threaded connection between the two pieces of said contact;

one piece of said contact having a terminal extending outwardly from said passage;

said one piece comprising a stamped and formed sheet metal element;

said other piece having a screw threaded rear portion; and said one piece having a forward tubular portion formed with axially and circumferentially spaced inwardly extending dimples forming a thread matching the screw threads on said rear portion.

4. A two-piece contact comprising:

a forward mating section and a rear termination section, said rear section being a stamped and formed sheet metal member;

said forward section having a forward mating portion and a rear portion, said rear portion being formed with screw threads thereon;

said rear section having a generally tubular forward portion mounted on said rear portion of said forward section of said contact; and said tubular forward portion of said rear section embodying a plurality of axially and circumferentially spaced projections forming screw thread segments matching said screw threads on said rear portion of said forward section of said contact to hold said forward and rear sections together.

5. An electrical connector comprising:

an insulator having a front face and a rear face with at least one contact passage extending therethrough opening at said faces;

a contact mounted in said passage, said contact having a forward mating section and a rear termination section;

said forward section of said contact being mounted in said passage from said front face;

said rear section of said contact being mounted in said passage from said rear face;

said forward section of said contact having a mating portion adjacent to said front face and a rear portion adjacent to said rear face;

said rear section of said contact embodying a generally tubular forward portion surrounding said rear portion of said front section of said contact, said tubular portion being slidably mounted in said passage;

said rear portion of said forward section of said contact having screw threads thereon, one of said threads providing forwardly facing shoulder;

means connecting said rear section of said contact ot said rear portion of said front section of said contact, said connecting means comprising an element extending inwardly from said tubular portion and engaging said shoulder;

means restricting axial movement of said contact in said passage; and said rear section of said contact embodying a terminal extending rearwardly from said rear face of said insulator.

6. An electrical connector as set forth in claim 5 wherein:

said tubular portion embodies a plurality of said elements formed as relatively rigid dimples spaced axially and circumferentialy from each other in a path to form screw thread segments matching said screw threads on said rear portion of said forward section of said contact.

* * * * *